US008887928B2

(12) United States Patent
Murakami

(10) Patent No.: US 8,887,928 B2
(45) Date of Patent: Nov. 18, 2014

(54) FRAME AND FRAME COUPLING MEMBER

(71) Applicant: Fujitsu Limited, Kawasaki (JP)

(72) Inventor: Hajime Murakami, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/668,587

(22) Filed: Nov. 5, 2012

(65) Prior Publication Data

US 2013/0140252 A1    Jun. 6, 2013

(30) Foreign Application Priority Data

Dec. 2, 2011 (JP) ................. 2011-264276

(51) Int. Cl.
*A47F 7/00* (2006.01)
*F16B 7/00* (2006.01)
*H05K 7/18* (2006.01)
*H05K 5/00* (2006.01)
*F16B 7/04* (2006.01)

(52) U.S. Cl.
CPC .. *H05K 7/18* (2013.01); *F16B 7/00* (2013.01); *H05K 5/0021* (2013.01); *F16B 7/0486* (2013.01)
USPC ............................ 211/13.1; 211/189; 403/345

(58) Field of Classification Search
CPC ........... A47B 47/0008; A47B 47/0016; A47B 47/0025; A47B 47/0033; A47B 47/0041; A47B 47/005; F16B 12/44
USPC .................. 211/13.1, 26, 26.2, 153, 189; 312/265.1; 403/170, 217, 345
See application file for complete search history.

(56) References Cited

U.S. PATENT DOCUMENTS

| 2,588,818 | A | * | 3/1952 | Franks | 403/217 |
|---|---|---|---|---|---|
| 3,370,871 | A | * | 2/1968 | Piarotto | 403/219 |
| 3,485,405 | A | * | 12/1969 | Dement | 217/65 |
| 4,005,559 | A | * | 2/1977 | Mathou | 52/282.4 |
| 5,516,225 | A | * | 5/1996 | Kvols | 403/170 |
| 2002/0090256 | A1 | * | 7/2002 | Chin et al. | 403/175 |
| 2006/0076858 | A1 | * | 4/2006 | Nohl | 312/257.1 |
| 2012/0294675 | A1 | * | 11/2012 | Chang | 403/354 |

FOREIGN PATENT DOCUMENTS

JP    10-96413    4/1998

* cited by examiner

*Primary Examiner* — Korie H Chan
(74) *Attorney, Agent, or Firm* — Staas & Halsey LLP

(57) ABSTRACT

A frame includes a first frame member that has a first opening at an end portion thereof; a second frame member that has a second opening at an end portion thereof; a first frame coupling member that comprises a first projection that fits into the first opening and a second projection that fits into the second opening; and a second frame coupling member that couples to the first frame coupling member, wherein: the first frame member and the second frame member are located so as to be sandwiched between the first frame coupling member and the second frame coupling member when the first frame coupling member and the second frame coupling member are coupled to each other.

15 Claims, 15 Drawing Sheets

US 8,887,928 B2

FRAME AND FRAME COUPLING MEMBER

CROSS-REFERENCE TO RELATED APPLICATION(S)

This application is based upon and claims the benefit of priority of the prior Japanese Patent Application No. 2011-264276, filed on Dec. 2, 2011, the entire contents of which are incorporated herein by reference.

FIELD

The embodiments discussed herein are related to a frame and a frame coupling member.

BACKGROUND

A case that stores electronic devices such as communication devices is known. FIG. 13 is a diagram that illustrates an example of a case mounted in a so-called 19-inch rack (the width of the rack is 19 inches). FIG. 13 is a diagram of the 19-inch rack and the case as seen from a direction in which the case is mounted in the 19-inch rack. In FIG. 13, a portion surrounded by a thick black-line border is the case mounted in the 19-inch rack. In the case, for example, electronic devices that cause the case to serve as a server apparatus are stored. The case is formed by, for example, bending a plate of aluminum or the like. Alternatively, the case may, for example, be formed as a frame.

In recent years, the packaging density of electronic devices stored in a case has increased. The total weight of the electronic devices stored in the case increases as the packaging density increases. However, a case formed by bending a plate may not have sufficient strength with respect to the increased total weight of the electronic devices. In addition, when the size of the case itself is increased to store more electronic devices, the strength of the case may decrease.

A frame may be used to enhance the strength of a case. However, assembling the frame may take time and effort.

The related art regarding a frame is disclosed in, for example, Japanese Laid-open Patent Publication No. 10-096413.

SUMMARY

According to an aspect of the invention, a frame includes first frame member that has a first opening at an end portion thereof; a second frame member that has a second opening at an end portion thereof; a first frame coupling member that comprises a first projection that fits into the first opening and a second projection that fits into the second opening; and a second frame coupling member that couples to the first frame coupling member, wherein: the first frame member and the second frame member are located so as to be sandwiched between the first frame coupling member and the second frame coupling member when the first frame coupling member and the second frame coupling member are coupled to each other.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 14:
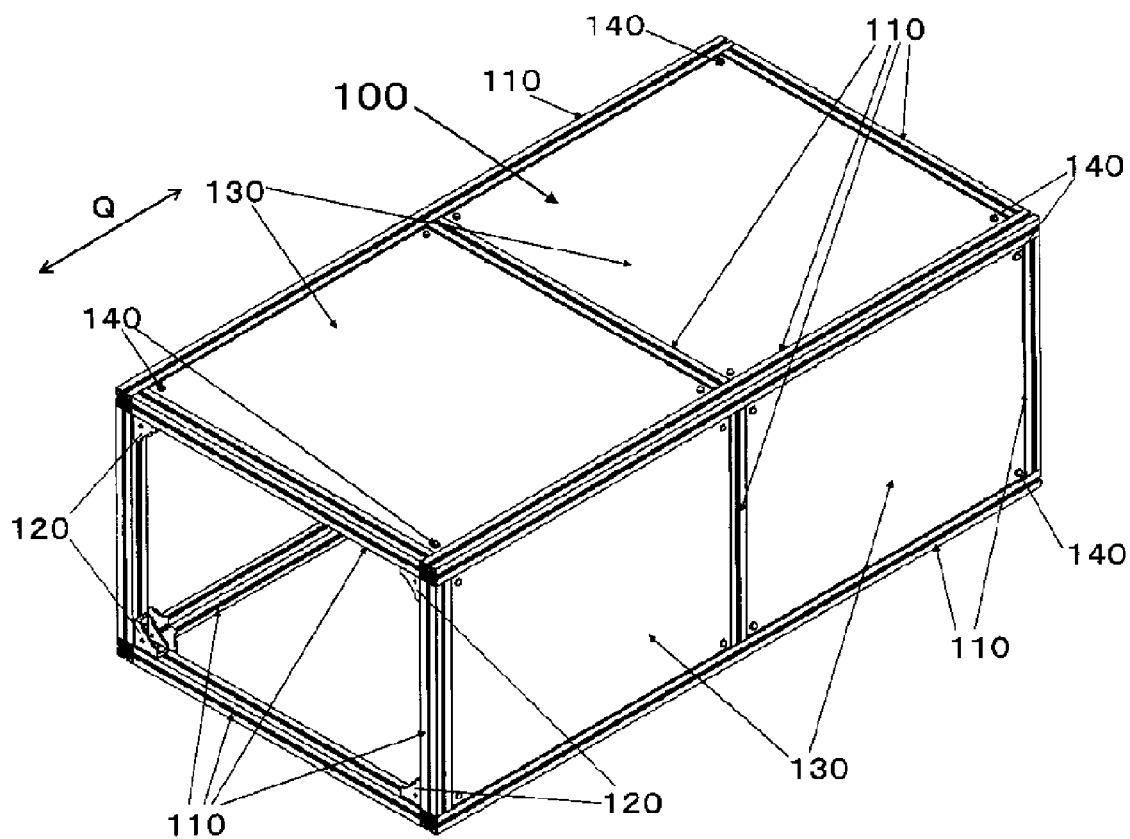
FIG. 14 is a perspective view illustrating a case according to the first embodiment.

FIG. 14 is a perspective view illustrating a case 100 according to a first embodiment. The case 100 according to the first embodiment is a case that includes metal frames 110, brackets 120, plates 130, and bolts 140. In the first embodiment, the metal frames 110, the brackets 120, and the plates 130 are made of aluminum, and the bolts 140 are made of stainless steel, but materials other than stainless steel may be used. In the first embodiment, two metal frames 110 are coupled to a bracket 120 by using a bolt 140, and a substantially rectangular frame is formed. In addition, a plate 130 is coupled to brackets 120 by bolts 140. In the case 100 in FIG. 14, no plate 130 is provided with two faces substantially perpendicular to axis Q, and thus the case 100 has openings. However, two plates 130 may be additionally provided with two faces substantially perpendicular to the axis Q to close the openings in FIG. 14.

Figure 15:
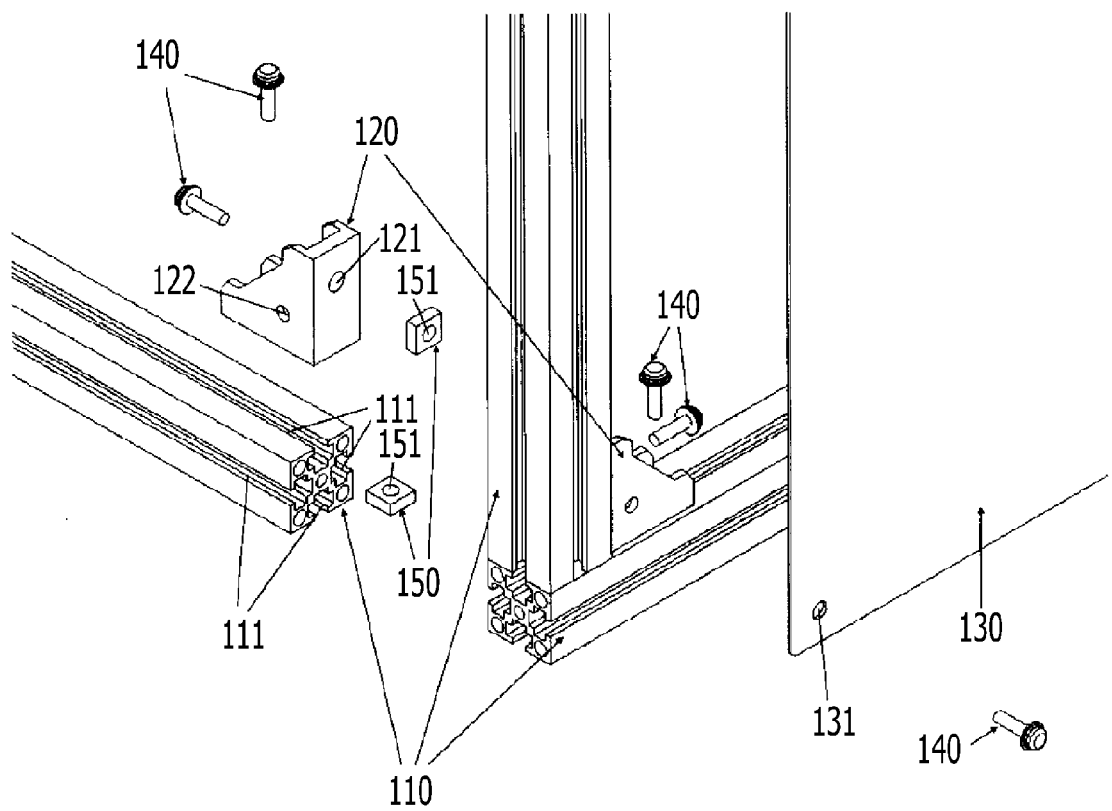
FIG. 15 is a diagram illustrating a situation in which metal frames, brackets, a plate, bolts, and nuts are being coupled to each other in a case.

FIG. 15 is a diagram illustrating a situation in which the metal frames 110, the brackets 120, and the plate 130 of the case 100 according to the first embodiment are being coupled to each other by using bolts 140. Each metal frame 110 of the case 100 according to the first embodiment has a substantially square cross section and four grooves 111 extending in the longitudinal direction. Each groove 111 may have a space into which a nut 150 is inserted. The cross section of each metal frame 110 is not limited to a square.

In the first embodiment, the nuts 150 are inserted into the grooves 111 of the metal frames 110. The bolts 140 are inserted through openings 121 of the brackets 120. Then, the bolts 140 are screwed into screw holes 151 of the nuts 150 that have been inserted into the grooves 111 of the metal frames 110 and that are made of stainless steel. As a result, the metal frames 110 and the brackets 120 are coupled to each other. The nuts 150 may be made of a material other than stainless steel. Each bracket 120 has two openings 121. Two metal frames 110 and a bracket 120 may be coupled to each other.

When a plate is coupled to the case 100, as illustrated in FIG. 15, an opening 131 may be provided in the plate 130, a screw hole 122 may be provided in the bracket 120, the bolt 140 may be inserted into the screw hole 122 through the opening 131, whereby the plate 130 may be coupled to the case 100.

Through the above coupling, the case 100, that has a substantially square shape as illustrated in FIG. 14, may be formed. The shape of the case 100 is not limited to the shape illustrated in FIG. 14.

Figure 1:
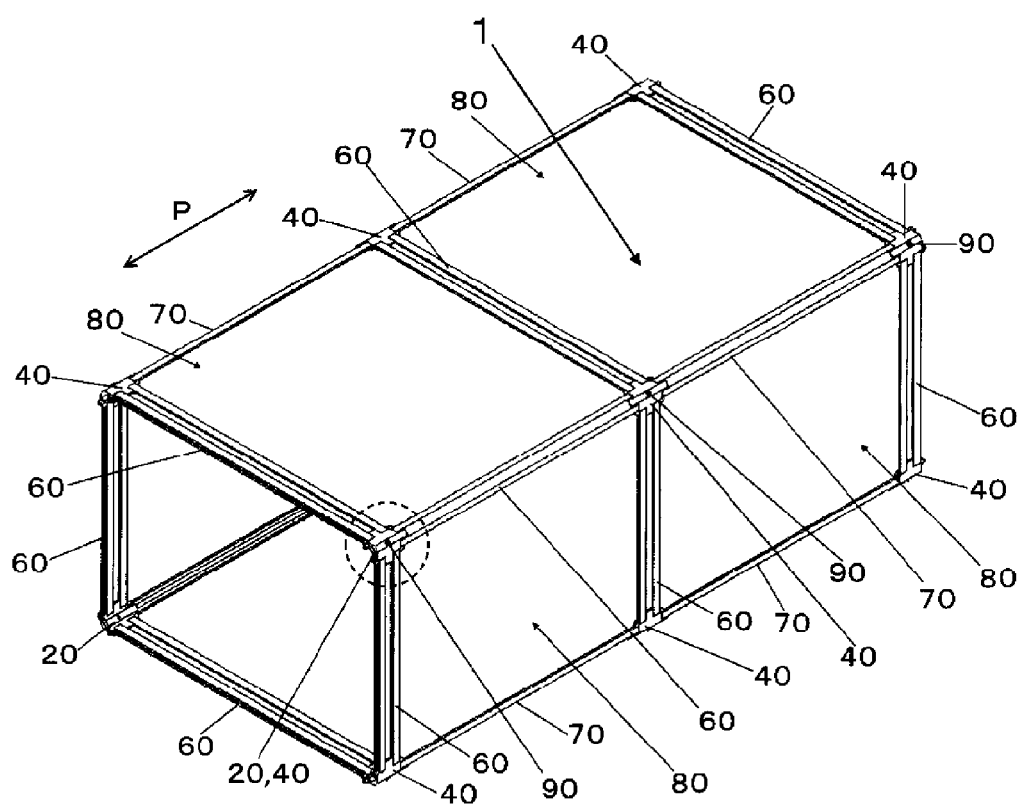
FIG. 1 is a perspective view illustrating a case 1.
Figure 2:
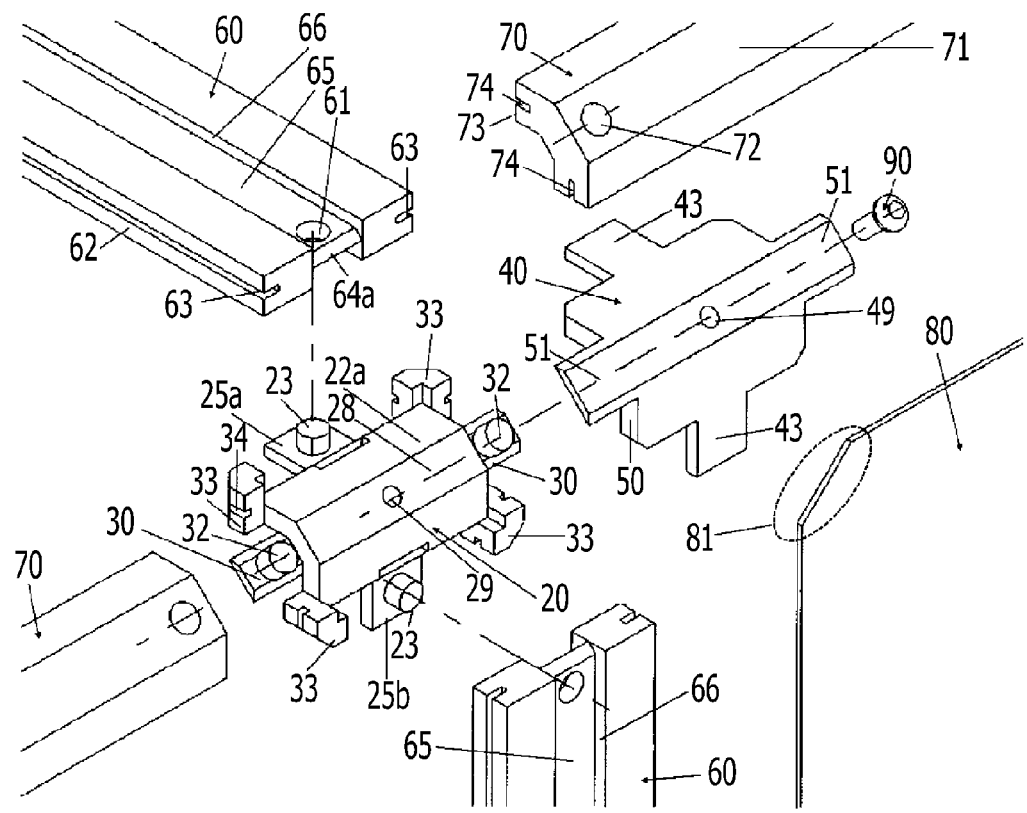
FIG. 2 is a an exploded perspective view illustrating a situation in which frame coupling members, frame members, a plate, and a screw are coupled to each other.

A mode of a second embodiment will be described. FIG. 1 is a perspective view illustrating a case 1 according to the second embodiment in that a frame is used. The case 1 according to the second embodiment includes frame coupling members 20 and frame coupling members 40 for coupling the frame, frame members 60, frame members 70, plates 80, and screws 90 for coupling between the frame coupling members. FIG. 2 is an exploded perspective view illustrating a situation in that a frame coupling member 20, a frame coupling member 40, frame members 60, frame members 70, and a plate 80 are being coupled to each other via a screw 90. In the second embodiment, a plurality of the frame members 60 and a plurality of the frame members 70 are sandwiched between a frame coupling member 20 and a frame coupling member 40. The screw 90 is inserted into a screw hole 29 through an opening 49. As a result, the frame coupling member 20 and the frame coupling member 40 are coupled to each other. In this example, four frame members may be coupled to each other by fastening a single screw, and thus it may be easy to assemble the frame. Alternatively, two frame members or three frame members may be coupled to each other.

FIG. 1 illustrates an example where a case whose two faces that are substantially perpendicular to an axis P are opened is manufactured by using twelve pairs of frame coupling members 20 and frame coupling members 40, twelve frame members 60, eight frame members 70, eight plates 80, and twelve screws 90. However, two plates 80 may be additionally provided to close the openings.

In the second embodiment, the frame members 60 and the frame members 70 illustrated in FIG. 2 and the like are produced by extrusion molding from aluminum as a material. The frame members 60 and the frame members 70 may be molded from a material other than aluminum. Each frame member 60 may have a cross-sectional shape in which a center portion of each long side of the cuboid shape of frame 62 is recessed as illustrated in FIG. 2. In this case, surfaces 65 and 66 are formed in each frame member 60.

In an end portion of each frame member 60 in the longitudinal direction thereof, an opening 61 is provided which is to fit onto a projection 23. In the longitudinal direction of thick-portion surfaces 62 there are grooves 63 into which the plates 80 may be inserted.

Each frame member 70 has a surface 71 which is to come into contact with a surface 52, as illustrated in FIG. 2. The surface 52 is a back surface of a protruding portion 51 in FIG. 2. In an end portion of the surface 71 of the frame member 70, an opening 72 which is to fit onto a projection 32 and a projection 53 provided on the protruding portion 51 is opened in a direction substantially perpendicular to the surface 71.

The frame member 70 has surfaces 73 that are to come into contact with side surfaces of reinforcing projections 33. Each surface 73 is provided with a groove 74 into which the plate 80 may be inserted.

As the plate 80 illustrated in FIG. 2 and the like, a plate made of aluminum is used in the present embodiment. However, the plate 80 may be a plate that is formed from a material other than aluminum. In addition, the corners of the plate 80 may be chamfered as illustrated in FIG. 2. In FIG. 2, one of the chamfered corners of the plate 80 is illustrated as a chamfered portion 81. When the corners of the plate 80 are chamfered, the plate 80 may fit into the groove 34 to suppress interference with the frame coupling member 20.

Figure 3A:
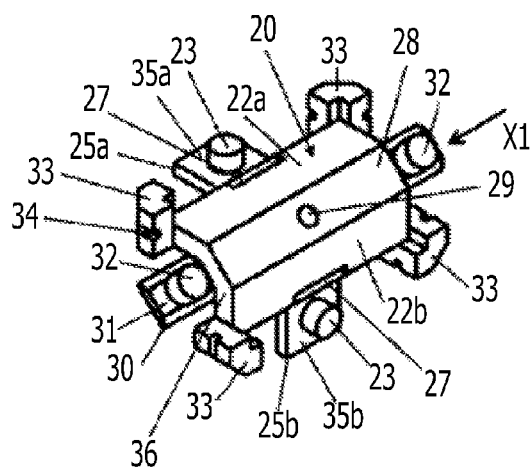
FIGS. 3A to 3D are diagrams illustrating an example of the frame coupling member.
Figure 3B:
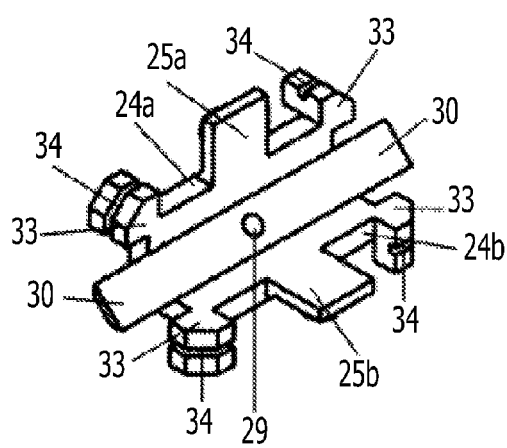
Figure 3C:
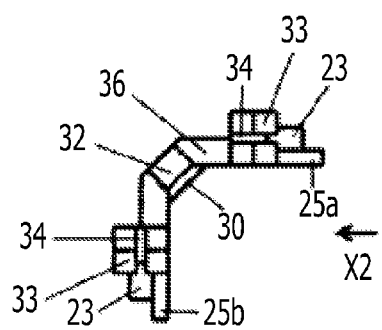
Figure 3D:
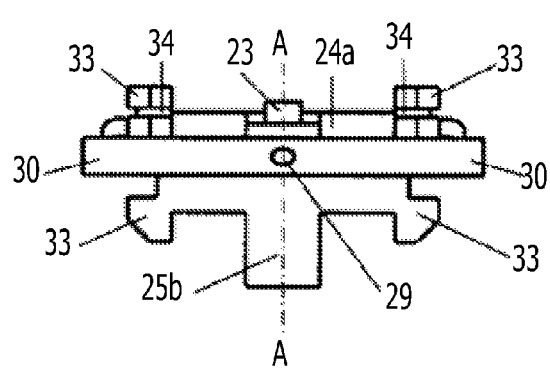
Figure 4:
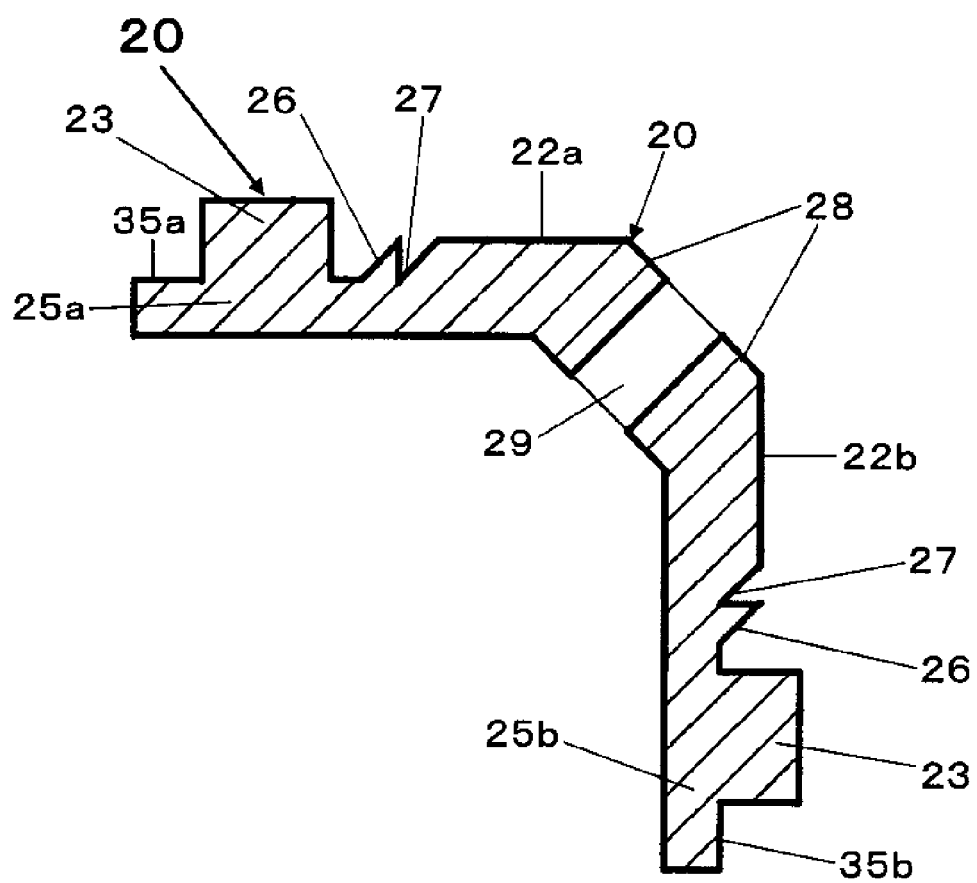
FIG. 4 is a cross-sectional view taken along a dot-dash line A-A in FIG. 3D.

FIGS. 3A to 3D are diagrams illustrating an example of the frame coupling member 20. FIG. 3A is a perspective view. FIG. 3B is a perspective view as seen from the direction opposite to FIG. 3A. FIG. 3C is a view as seen from a direction X1 in FIG. 3A. FIG. 3D is a view as seen from a direction X2 in FIG. 3C. FIG. 4 is a cross-sectional view taken along a dot-dash line A-A in FIG. 3D.

As illustrated in FIGS. 3A to 3D, the frame coupling member 20 includes surfaces 22a and 22b, a surface 24a substantially perpendicular to the surface 22a, and a surface 24b substantially perpendicular to the surface 22b. The frame coupling member 20 has a protruding portion 25a that protrudes from the surface 24a in a direction substantially perpendicular to the surface 24a. The frame coupling member 20 has a protruding portion 25b that protrudes from the surface 24b in a direction substantially perpendicular to the surface 24b.

The protruding portion 25a has a surface 35a substantially parallel to the surface 22a. In addition, the protruding portion 25a is provided with a projection 23 that protrudes from the surface 35a. The protruding portion 25b has a surface 35b substantially parallel to the surface 22b. The protruding portion 25b is provided with a projection 23 that protrudes from the surface 35b.

As illustrated in FIG. 4, the protruding portions 25a and 25b are provided with tapered surfaces 26. In addition, the frame coupling member 20 is provided with triangular grooves 27 adjacent to the tapered surfaces 26.

Referring back to FIGS. 3A to 3D, the frame coupling member 20 is provided with a surface 28 that is located between and adjacent to the surface 22a and the surface 22b, that are substantially orthogonal to each other.

The surface 28 is provided with the screw hole 29 that is opened in a direction substantially perpendicular to the surface 28. The surface 28 may also be provided so that the angle formed between the surface 28 and the surface 22a is approximately equal to the angle formed between the surface 28 and the surface 22b. As a result, when the frame coupling member 20, the frame coupling member 40, and the two frame members 60 are coupled to each other by using the screw 90, the fastening force of the screw 90 may be substantially equally transmitted to the two frame members 60.

The frame coupling member 20 has protruding portions 30 each including a surface 31 roughly parallel to the surface 28 and a cylindrical projection 32 that protrudes from the surface 31 in a direction substantially parallel to the axis of the screw hole 29. The protruding portions 30 are provided so as to protrude in two directions, respectively, that are substantially perpendicular to a line that connects the center of the screw hole 29 and the center of the projection 23 in FIGS. 3A to 3D, namely, to the A-A cross section.

Furthermore, at corners of each of the surface 22a and the surface 22b, the frame coupling member 20 is provided with two reinforcing projections 33. Each reinforcing projection 33 may be provided with a groove 34 into which the plate 80 may be inserted.

Figure 5A:
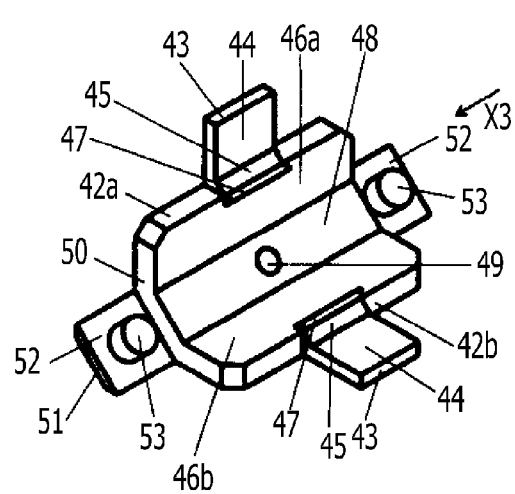
FIGS. 5A to 5D are diagrams illustrating an example of the a frame coupling member.
Figure 5B:
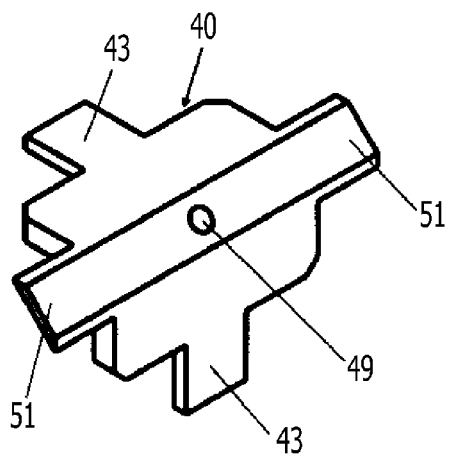
Figure 5C:
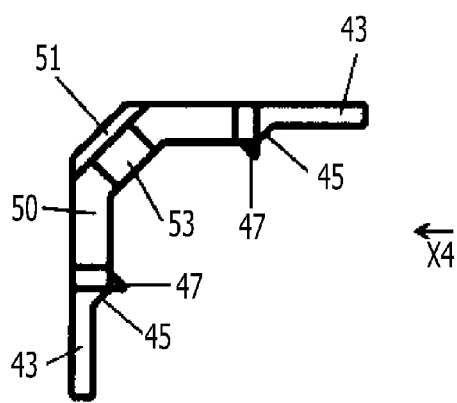
Figure 5D:
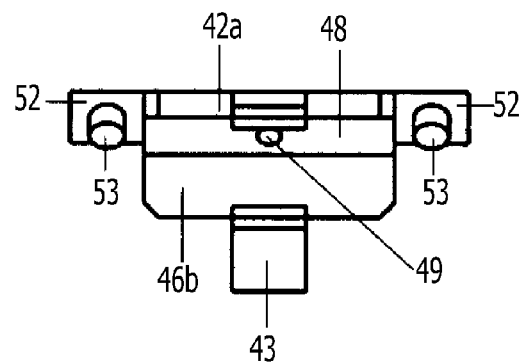

FIGS. 5A to 5D are diagrams illustrating an example of the frame coupling member 40. FIG. 5A is a perspective view. FIG. 5B is a perspective view as seen from the direction opposite to FIG. 5A. FIG. 5C is a view as seen from a direction X3 in FIG. 5A. FIG. 5D is a view as seen from a direction X4 in FIG. 5C. The frame coupling member 40 has surfaces 46a and 46b that are substantially orthogonal to each other. The frame coupling member 40 has a surface 42a substantially perpendicular to the surface 46a and a surface 42b substantially perpendicular to the surface 46b.

The surface 46a and the surface 46b face the surface 22a and the surface 22b, respectively, when the frame coupling member 20 and the frame coupling member 40 are coupled to each other by the screw 90. The frame coupling member 40 is provided with protruding portions 43 that protrude from the surface 42a and the surface 42b. Each protruding portion 43 includes a tapered surface 45.

The surface 46a and the surface 46b of the frame coupling member 40 are provided with triangular projections 47 adjacent to the tapered surfaces 45. The projections 47 fit into the grooves 27 when the frame coupling member 20 and the frame coupling member 40 are coupled to each other by the screw 90.

In the frame coupling member 40 illustrated in FIGS. 5A to 5D, the surface 46a and the surface 46b are substantially orthogonal to each other. Between the surface 46a and the surface 46b, a surface 48 is provided so as to be adjacent to the surface 46a and the surface 46b.

The surface 48 is provided with a screw hole 49 that is opened in a direction substantially perpendicular to the surface 48. The surface 48 may be provided so that the angle formed between the surface 48 and the surface 46a is substantially equal to the angle formed between the surface 48 and the surface 46b. As a result, when the frame coupling member 20, the frame coupling member 40, and the two frame members 60 are coupled to each other by using the screw 90, the fastening force by the screw 90 may be substantially equally transmitted to the two frame members 60.

The surface 48 is provided with the opening 49 which is opened in a direction substantially perpendicular to the surface 48. The frame coupling member 40 has protruding portions 51 that protrude from the surface 50 so as to be substantially perpendicular to the surface 50. Each protruding portion 51 has a surface 52 substantially parallel to the surface 48. Each surface 52 is provided with a cylindrical projection 53 that protrudes in a direction substantially parallel to the axis of the opening 49.

In the second embodiment, the edge between the surface 50 and the surface 42a and the edge between the surface 50 and the surface 42b may be chamfered as illustrated in FIGS. 5A to 5D. As a result, when the frame coupling member 20 and the frame coupling member 40 are fastened through a procedure below, interference from the corners of the frame coupling member 40 with the frame coupling member 20 may be avoided.

Figure 6:
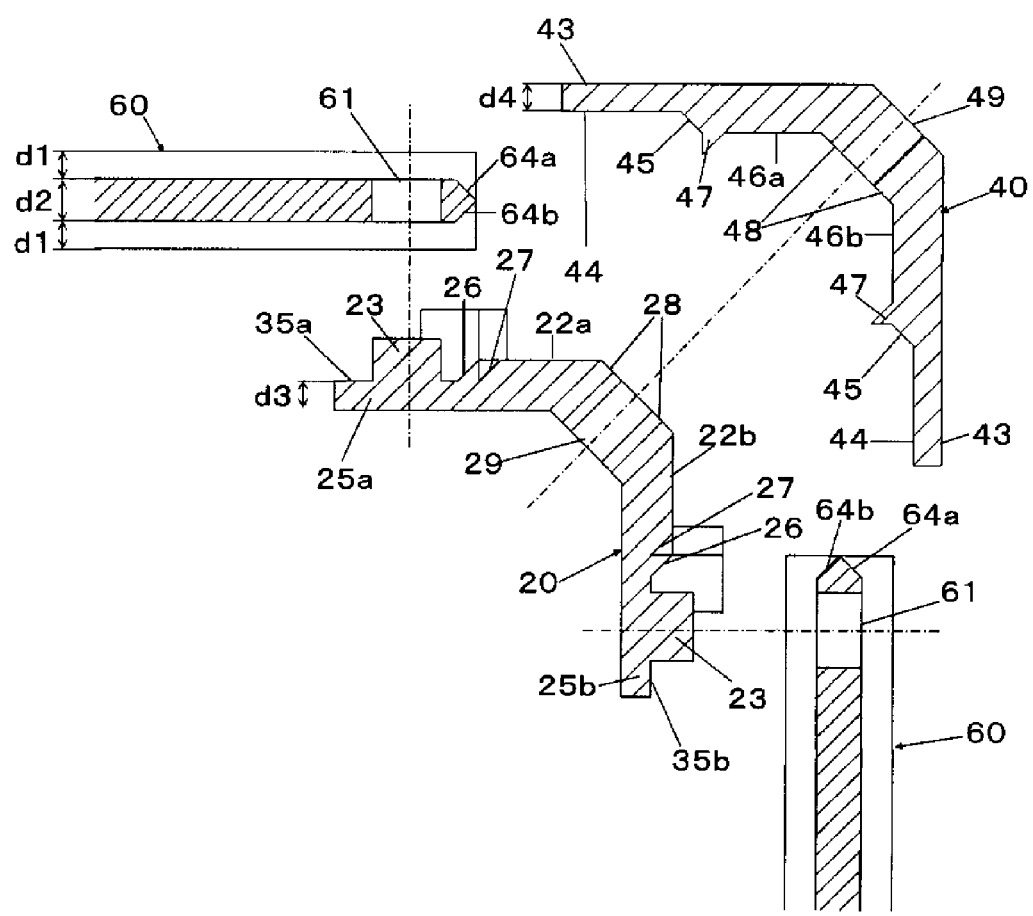
FIG. 6 is an exploded side view illustrating a situation in which the frame coupling members and the frame members are being coupled to each other.
Figure 7:
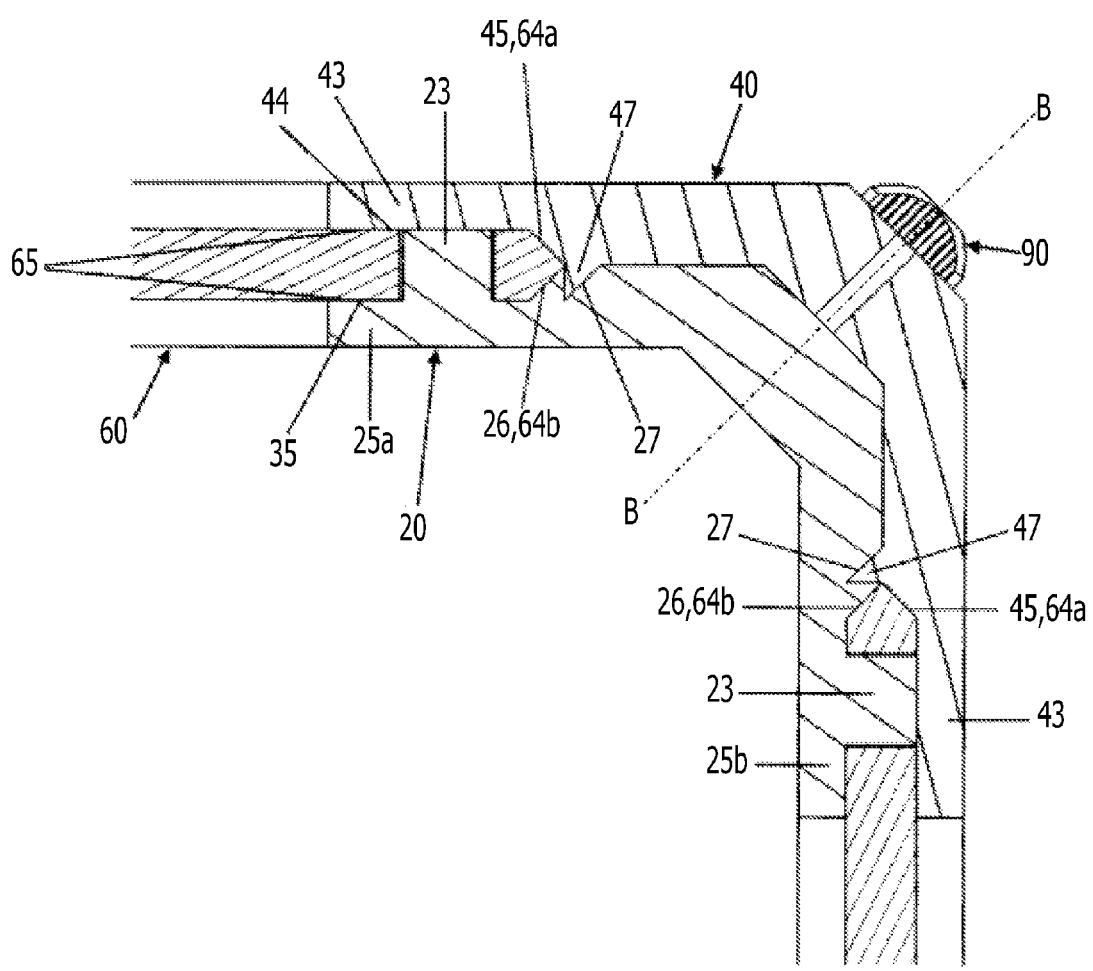
FIG. 7 is a cross-sectional view illustrating a situation in which the frame coupling members and the frame members are coupled to each other.

FIG. 6 is an exploded side view illustrating a situation in which the frame coupling member 20, the frame coupling member 40, and the frame members 60 are being coupled to each other. FIG. 7 is a cross-sectional view illustrating a state in which the frame members 60 are coupled to the frame coupling members 20 and 40. As illustrated in FIG. 6, the depth d1 of the recess at the center of each frame member 60 may be larger than the thicknesses d3 of the protruding portions 25a and 25b and the thicknesses d4 of the protruding portions 43. In addition, the dimension d2 illustrated in FIG. 6 may be substantially equal to the intervals between the surfaces 35a and 35b and the surfaces 44 when the frame coupling member 20 and the frame coupling member 40 are coupled to each other. With the dimensions set as described above, for example, when the case is formed, the protruding portions 25a and 25b and the protruding portions 43 do not protrude from the recesses of the frame members 60 which have the surfaces 65 and 66, and an increase in external dimensions of the case and a reduction of a space in the case in which an electronic device may be effectively mounted may be avoided.

For example, in the second embodiment, the dimension d1, the thicknesses d3 of the protruding portions 25a and 25b, and the thicknesses d4 of the protruding portions 43 are substantially equal to each other. In addition, the dimension d2 is substantially equal to the intervals between the surfaces 35a and 35b and the surfaces 44 when the frame coupling member 20 and the frame coupling member 40 are coupled to each other. Thus, as illustrated in FIG. 7, the frame coupling member 20, the frame coupling member 40, and the frame members 60 may also be coupled to each other without the protruding portions 43 and the protruding portions 25a and 25b protruding from the frame members 60. In FIG. 7, the surface 65 of each frame member 60 on the upper side is in contact with the surface 44, and the surface 65 of each frame member 60 on the lower side is in contact with the surface 35a or 35b. Thus, the area through which the fastening force of the screw 90 is transmitted to each frame member 60 may also be increased.

As illustrated in FIGS. 6 and 7, there is a tapered surface 64a at an end of the surface 65 of each frame member 60. Each tapered surface 64a is in contact with the surface 45 of the frame coupling member 40. In addition, there is a tapered surface 64b on the back side of each tapered surface 64a. Each tapered surface 64b is in contact with the surface 26 of the frame coupling member 20. Therefore, when coupling, the tapered surface 26 faces and comes into contact with the tapered surface 64b, and the tapered surface 45 faces and comes into contact with the tapered surface 64a. When the tapered surface 64a and the tapered surface 45 are substantially perpendicular to the fastening direction of the screw 90, the fastening force of the screw 90 may be transmitted to the frame member 60 in a direction which is the same as the fastening direction of the screw 90. Thus, the fastening force to be transmitted to the frame may be increased.

When coupling, each projection 47 fits into the groove 27 as illustrated in FIG. 7. As the fastening force of the screw 90 increases, a force applied to each tapered surface 45 in a direction substantially perpendicular to the tapered surface 45 increases. At the same time, a force applied to the tapered surface 45 in a direction substantially parallel to the tapered surface 45 also increases. The force applied in the direction substantially parallel to the tapered surface 45 is a force applied in a direction in which the protruding portion 43 is reflexed relative to the frame member 60 when coupling. With the projection 47, which has fitted into the groove 27, receiving the force applied in the direction substantially perpendicular to the tapered surface 45, breakage and deformation of the protruding portions 43 may be suppressed even when the fastening force of the screw 90 increases. Therefore, the frame coupling member 40 may transmit the fastening force of the screw 90 to the frame members 60 while suppressing deformation and breakage.

Figure 8:
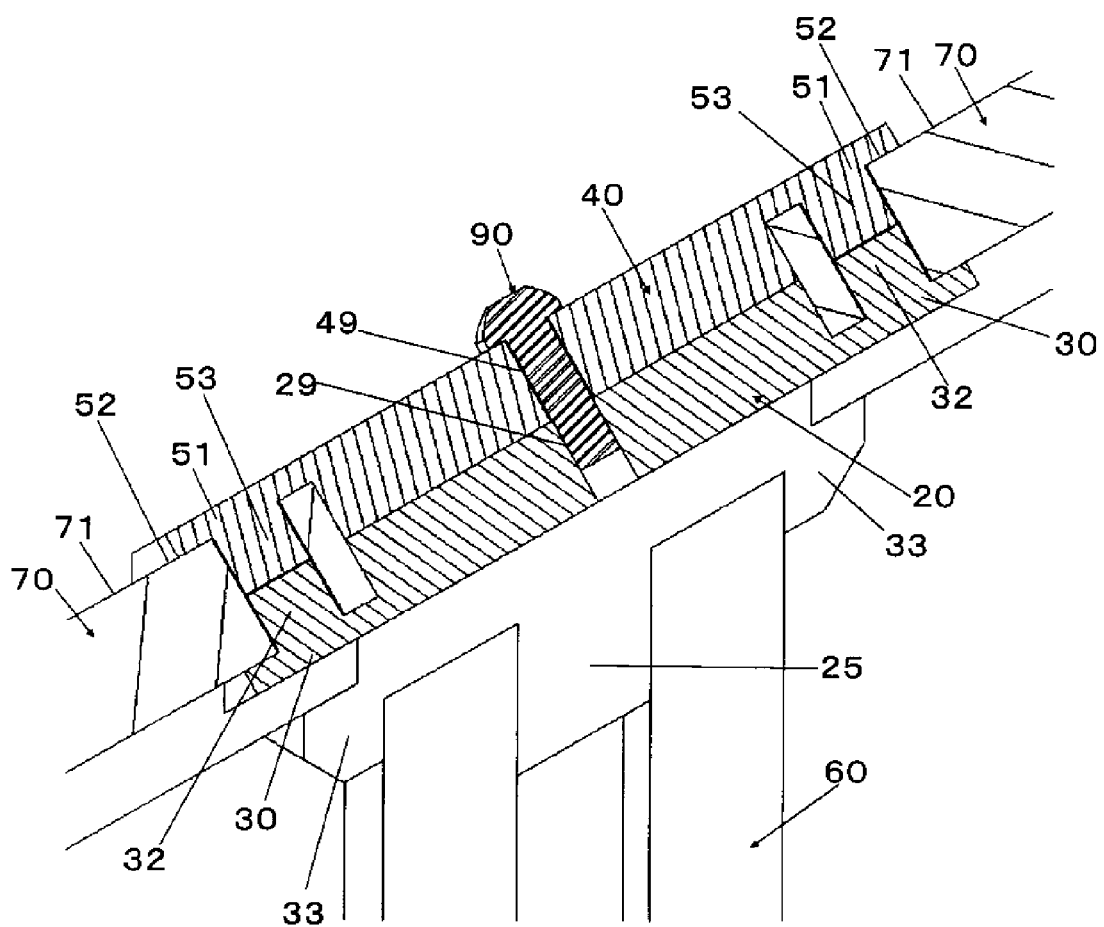
FIG. 8 is a perspective view illustrating a situation of a cross section taken along an alternate long and short dash line B-B in FIG. 7.

FIG. 8 is a perspective view that includes a cross-sectional view taken along a dot-dash line B-B in FIG. 7 when the frame members 70 are coupled by being sandwiched between the frame coupling member 20 and the frame coupling member 40. Each frame member 70 has a surface 71 substantially perpendicular to the opening 49. When the surfaces 52 are provided so as to be substantially perpendicular to the opening 49, the fastening force of the screw 90 may be transmitted to each frame member 70 through a surface of the frame member 70, which is substantially perpendicular to the fastening direction of the screw 90, and thus the fastening force transmitted to the frame may increase.

When coupling, each projection 53 fits into the opening 72 as illustrated in FIG. 8. As the fastening force of the screw 90 increases, a force by which the frame coupling member 40 fastens each frame member 70 increases. A reaction force for the force by which the frame coupling member 40 fastens each frame member 70 is applied to the frame coupling member 40, and when the fastening force of the screw 90 increases, the reaction force also increases. The reaction force for the force by which the frame coupling member 40 fastens each frame member 70 is a force applied in a direction away from the frame member 70 and against the protruding portion 51 when coupling. Since each projection 53 which has fitted into the opening 72 is in contact with the frame member 70, the contact portion between the projection 53 and the frame member 70 receives the reaction force for the force by which the frame coupling member 40 fastens each frame member 70. Thus, even when the fastening force of the screw 90 increases, breakage and deformation of the protruding portions 51 may be suppressed. Therefore, the frame coupling member 40 may transmit the fastening force of the screw 90 to the frame members 70 while suppressing deformation and breakage.

Next, a procedure of coupling each member will be described. First, as illustrated in FIG. 2, the opening 61 of each frame member 60 is fitted onto the projection 23 of the frame coupling member 20, and the opening 72 of each frame member 70 is fitted onto the projection 32. Then, the frame coupling member 40 is put over the frame coupling member 20 so as to cover the surface 28 side and so that the projection 53 on the back side of each protruding portion 51 is fitted into the opening 72.

Then, the screw 90 is inserted through the opening 49 into the screw hole 29 to couple the frame coupling member 20 and the frame coupling member 40. As a result, the frame members 60 and the frame members 70 are sandwiched and coupled between the frame coupling member 20 and the frame coupling member 40. Through the procedure described above, the frame coupling member 20, the frame coupling member 40, the two frame members 60, and the two frame members 70 may be coupled to each other by using a single screw 90.

Each projection 47 may be fitted into the groove 27 as illustrated in FIG. 7, and each projection 53 may be fitted into the opening 72 as illustrated in FIG. 8. As a result, shifting in position of the frame coupling member 20 and the frame coupling member 40 prior to coupling with the screw 90 may be avoided, and coupling may be more easily performed in the second embodiment.

Figure 9:
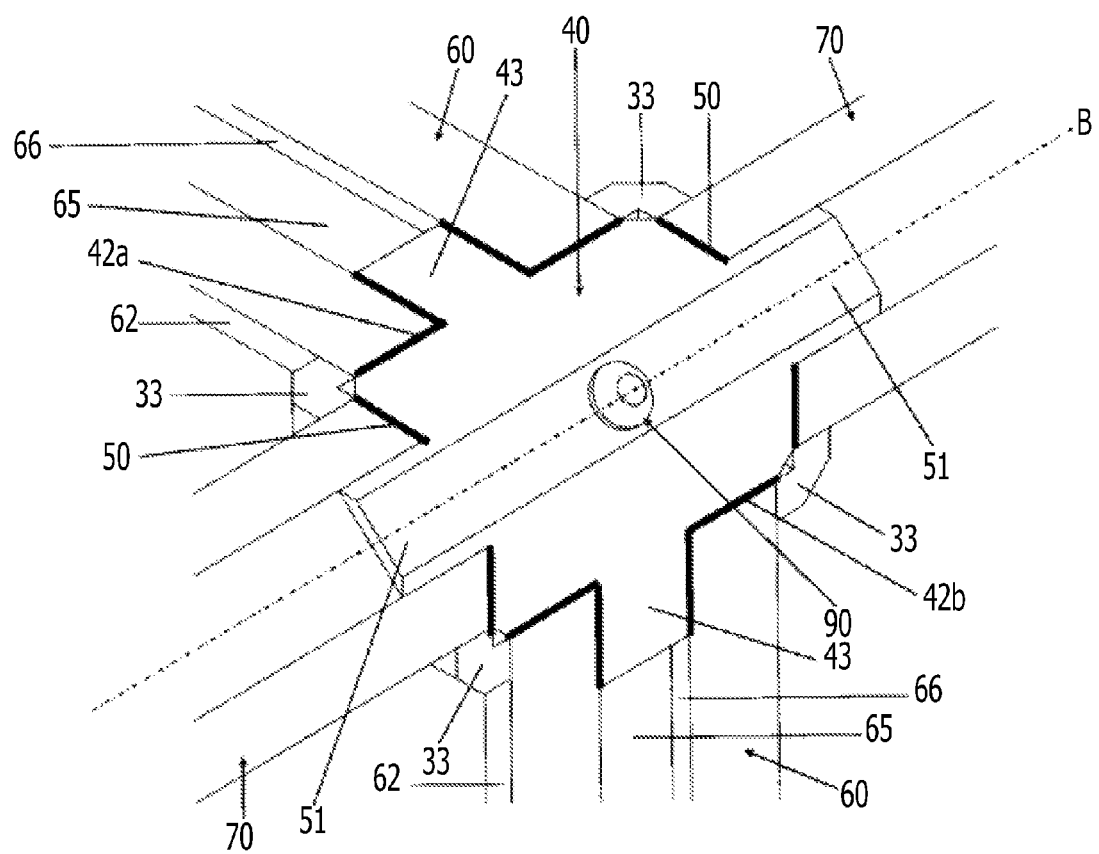
FIG. 9 is a perspective view of a situation in which the frame coupling members, the frame members, the plate, and the screw are coupled to each other, as seen from the frame coupling member side.
Figure 10:
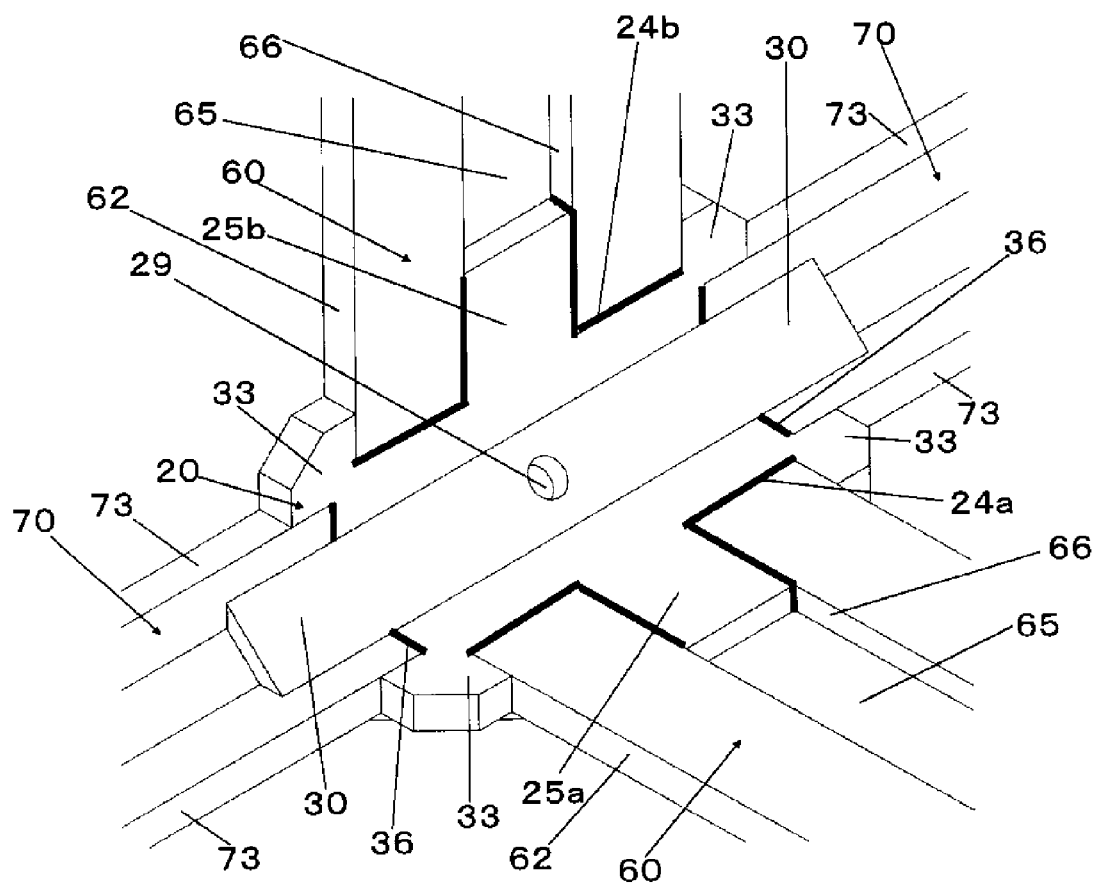
FIG. 10 is a perspective view of the situation in which the frame coupling members, the frame members, the plate, and the screw are coupled to each other, as seen from the frame coupling member side.

FIG. 9 is a perspective view illustrating a situation in which a frame coupling member 20, a frame coupling member 40, two frame members 60, and the two frame members 70 are coupled to each other by using a screw 90. FIG. 10 is a perspective view when the situation of the coupling illustrated in FIG. 9 is seen from the opposite side to FIG. 9. In FIGS. 9 and 10, the grooves 63 and the grooves 74 are omitted. Black thick line portions in FIG. 9 indicate portions where the frame coupling member 40 is in contact with the frame members 60 or the frame members 70. In addition, black thick line portions in FIG. 10 indicate portions where the frame coupling member 20 is in contact with the frame members 60 or the frame members 70.

When a force from outside is applied to the case 1 according to the second embodiment, forces applied in the longitudinal directions of the frame members 60 and in the longitudinal directions of the frame members 70 are received by, in particular, the protruding portions 25a and 25b, the protruding portions 30, the protruding portions 43, and the protruding portions 51 of the frame coupling member 20 and the frame coupling member 40. Furthermore, each reinforcing projection 33 may have surfaces that are in contact with the surface 62 and the surface 73 (see FIG. 10). When each reinforcing projection 33 is in surface contact with the surface 62 and the surface 73, the frame coupling member 20 may increase the surfaces that receive the external forces applied to the case 1.

In addition, with the case 1 according to the second embodiment, as indicated by the black thick line portions in FIGS. 9 and 10, each surface 36 of the frame coupling member 20 and each surface 50 of the frame coupling member 40 may be in contact with the end surface of each frame member 70 in the longitudinal direction. The surface 24a or 24b of the frame coupling member 20 may be in contact with the end surface of each frame member 60 in the longitudinal direction. The surface 42a or 42b of the frame coupling member 40 may be in contact with the end surface of each frame member 60 in the longitudinal direction. The side surfaces of each protruding portion 43 and the side surfaces 66 of the recess of each frame member 60 may be in contact with each other. Moreover, the side surfaces of the protruding portions 25a and 25b and the side surfaces 66 of the recesses of the frame members 60 may be in contact with each other. As a result, the external forces applied to the case 1 may be more suitably received.

When the plate 80 is coupled to the case 1 according to the second embodiment, the frame coupling member 20, the frame coupling member 40, the frame members 60, and the frame members 70 may be coupled to each other by using the screw 90 while the plate 80 is inserted into the grooves 62, the grooves 74, and the grooves 34. As a result, in addition to the frame members 60 and the frame members 70, the plate 80 may be coupled by the fastening with a single screw 90.

Figure 11:
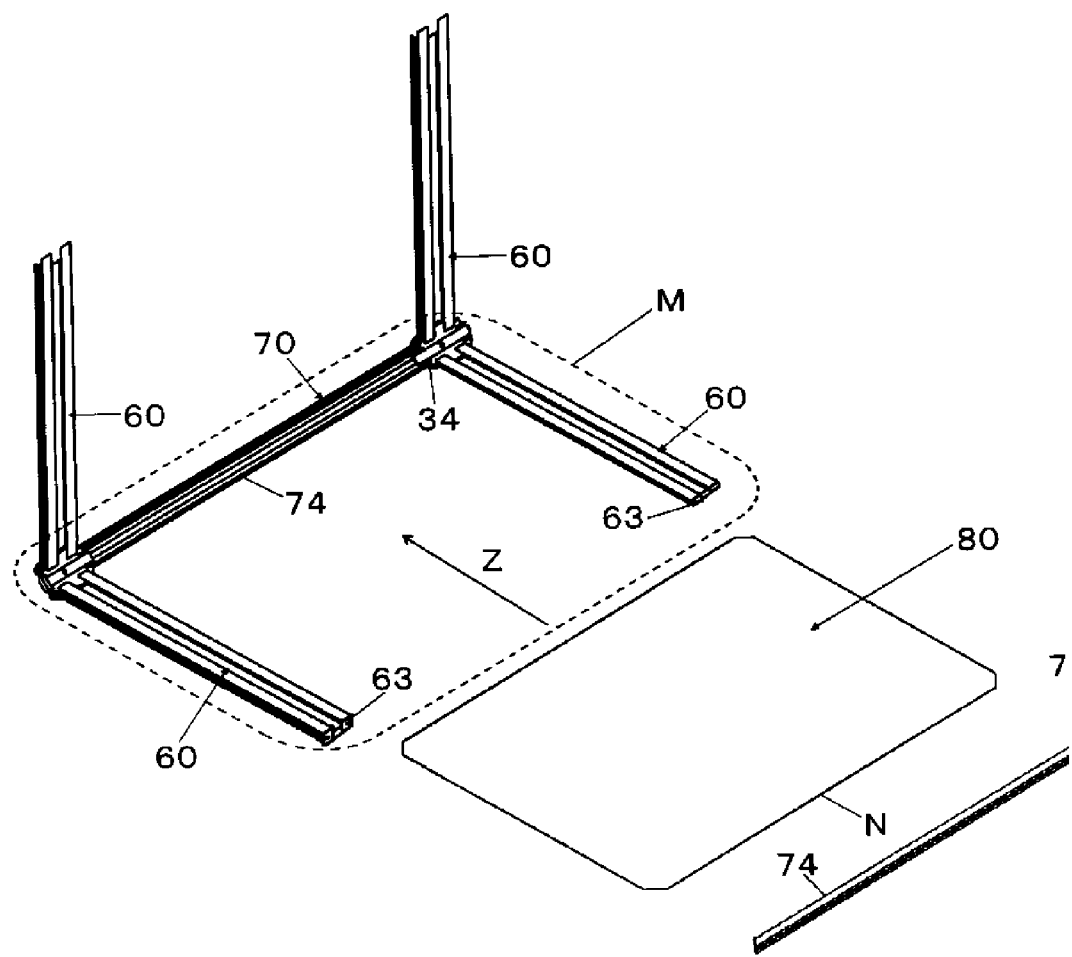
FIG. 11 is a perspective view illustrating a situation in which the case having the plate is being manufactured.

FIG. 11 is a perspective view illustrating a situation partway through the manufacture of the case 1. Preferably, the frame coupling members 20, the frame coupling members 40, and the frame members 60 and 70 are coupled to each other so as to be able to surround any three sides of the plate 80. Then, the plate 80 is inserted into the grooves 63, 74, and 34, and the frame member 60 or the frame member 70 that is to come into contact with one side of the plate 80 that is not in contact with the frame is coupled to the frame that surrounds the three sides of the plate 80. For example, in FIG. 11, in a portion M surrounded by a black dashed line, frame coupling members 20, frame coupling members 40, two frame members 60, one frame member 70 are coupled to each other so as to be able to surround three sides of the plate 80. The plate 80 is inserted into the grooves 63, the groove 74, and the groove 34 along a direction Z illustrated in FIG. 11. Then, an edge N of the plate 80 is inserted into the groove 74 of a frame member 70. Then, the portion M and the frame member 70 are coupled to each other via frame coupling members 20 and frame coupling members 40, whereby the plate 80 may be provided in the case 1 without screw-fastening of the plate 80.

Figure 12:
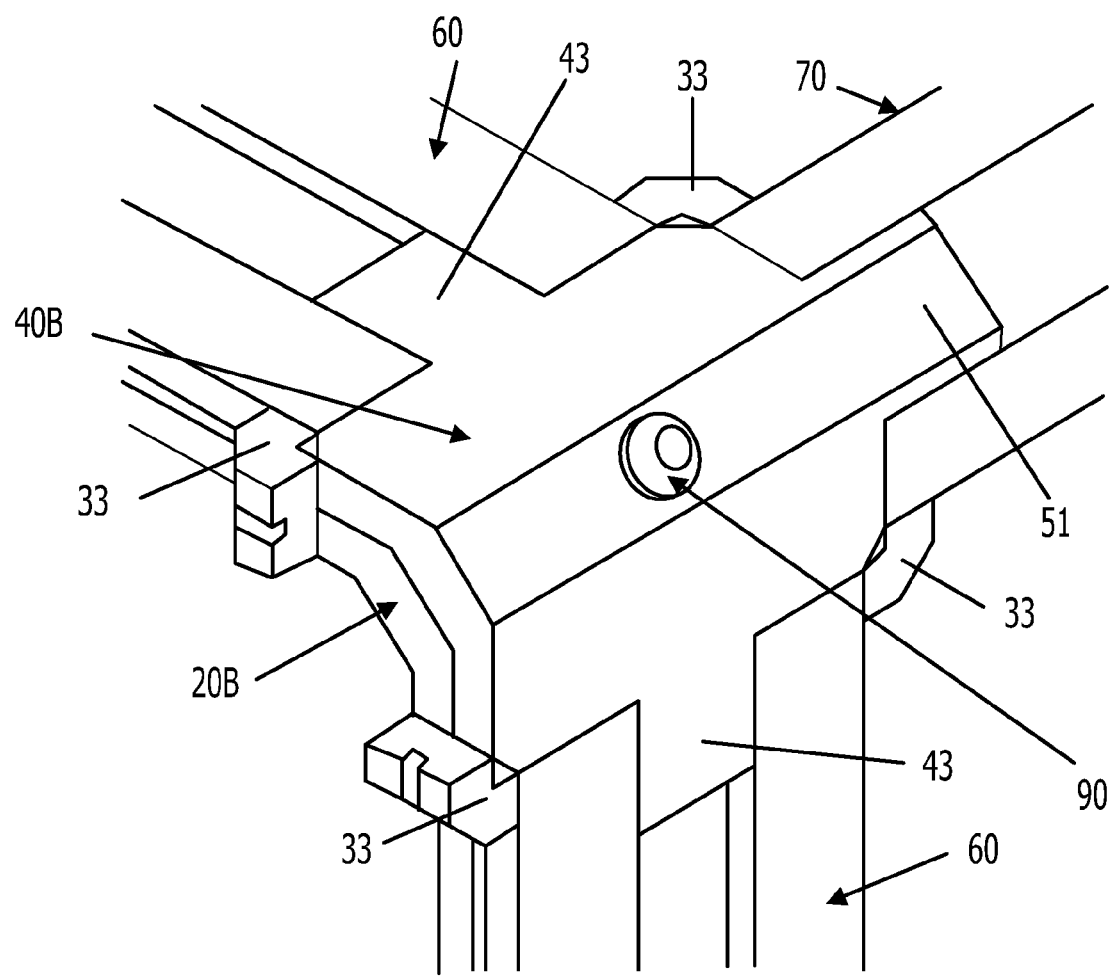
FIG. 12 is a perspective view illustrating frame coupling members.
Figure 13:
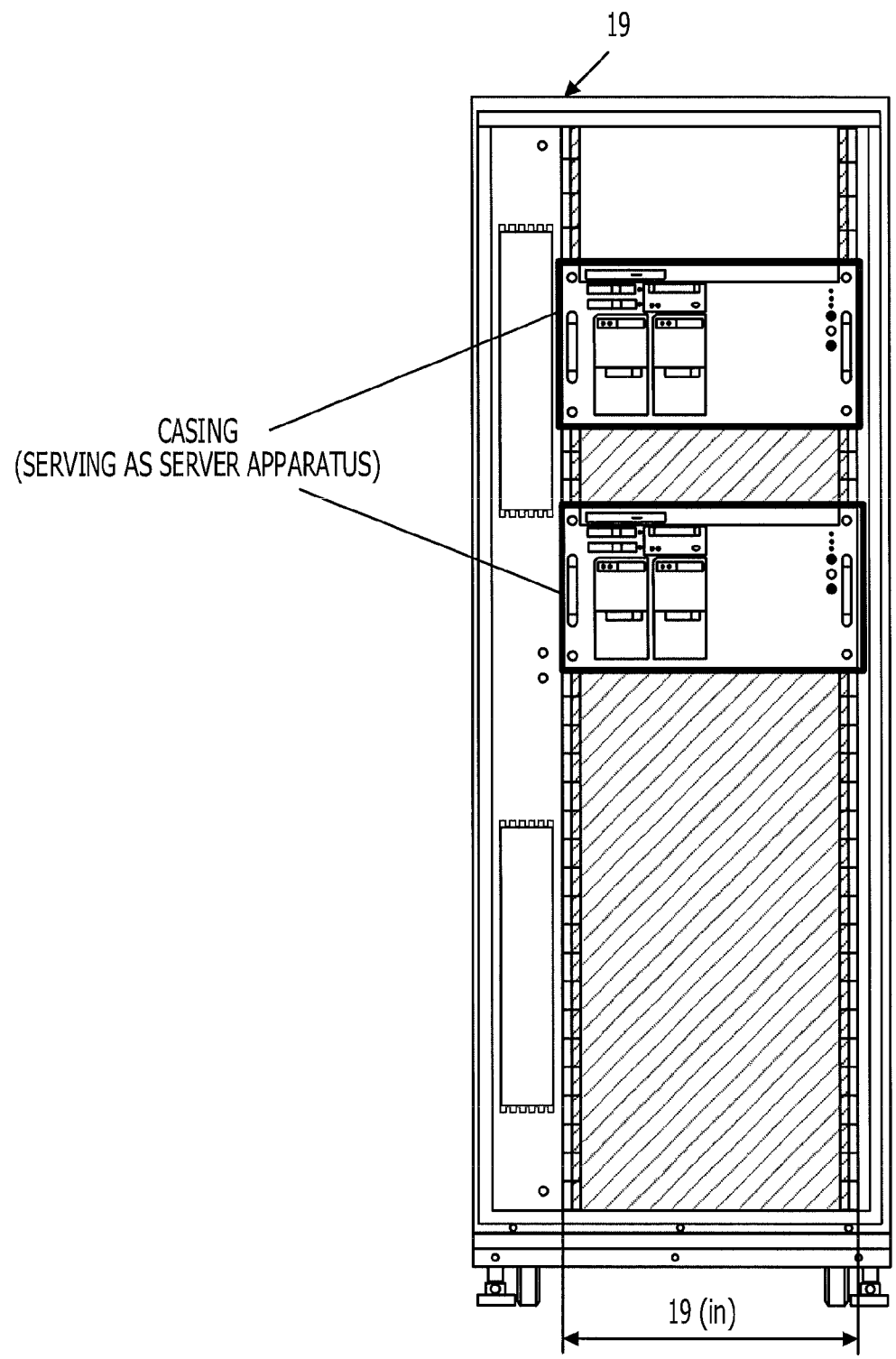
FIG. 13 is a diagram illustrating an example of a 19-inch rack according to the EIA standard.

FIG. 12 illustrates a frame coupling member 20B and a frame coupling member 40B that are modified examples of the frame coupling member 20 and the frame coupling member 40, respectively. While two protruding portions 30 are provided in the frame coupling member 20 and the frame coupling member 40 and two protruding portions 51 are provided in the frame coupling member 40, one of the protruding portions 30 is not provided in the frame coupling member 20B and one of the protruding portions 51 is not provided in the frame coupling member 40B illustrated in FIG. 12. When a frame is coupled by using the frame coupling member 20B and the frame coupling member 40B in FIG. 12, two frame members 60 and one frame member 70 may be coupled. If the frame coupling member 20B and the frame coupling member 40B are used, for example, for frame coupling at a corner of the case that is surrounded by a dashed line in FIG. 1, external dimensions may be reduced.

In the second embodiment, for example, when the frame of the case 1 illustrated in FIG. 1 is formed, the frame may be assembled through 12 screw fastening operations. Thus, assembling the frame may be easily performed through less screw fastening operations than the first embodiment.

In addition, in the second embodiment, by inserting the plate 80 into the grooves 62, the grooves 74, and the grooves 34, the frame of the case and the plate 80 may be coupled to each other. Thus, a screw fastening operation to couple the frame of the case and the plate 80 may possibly not be used. According to the second embodiment, assembling the case that has plates may be more easily performed than the first embodiment.

Furthermore, in the second embodiment, a nut may not be used to couple each member. Thus, for example, the number of parts that make up the case may be reduced and assembling the case 1 may be made easier.

In the second embodiment, the dimensions of the frame members 60 and the frame members 70 may be determined without taking into consideration spaces into which the nuts 150 are inserted as in the metal frame 110 according to the first embodiment. Thus, for example, the thicknesses of the frame members 60 and the frame members 70 may be reduced as compared to the metal frame 110 according to the first embodiment. Taking an electronic apparatus that stores electronic devices as an example, reduction of the thickness of the frame may also allows a space that may store electronic devices and the like to be increased within the electronic apparatus.

In the second embodiment, the material of each member is aluminum. However, the material of each member is not limited to aluminum. For example, when metal such as aluminum is used as the material, when used as a case which stores electronic devices, an effect such as a being able to block radio waves of electronic devices may also be obtained. Even when another material including metal other than aluminum is used, a case structure based on the spirit and scope of the embodiments may be realized.

In addition, the case according to this embodiment may be used as for other than a case for storing electronic devices.

Furthermore, the dimensions of each member are not uniquely determined, and the dimensions and the shapes may be changed without departing from the spirit and scope of the embodiments.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A frame comprising:
 a first frame member that has a first opening at an end portion thereof;
 a second frame member that has a second opening at an end portion thereof;
 a first frame coupling member that comprises a first projection that fits into the first opening and a second projection that fits into the second opening;
 a second frame coupling member coupled to the first frame coupling member
 grooves that are provided in the first frame member, the second frame member, the first frame coupling member, and the second frame coupling member; and
 a plate that is inserted into the grooves, wherein:
 the first frame member and the second frame member are sandwiched between the first frame coupling member and the second frame coupling member when the first frame coupling member and the second frame coupling member are coupled to each other.

2. The frame according to claim 1, further comprising a screw that couples the first frame coupling member and the second frame coupling member.

3. The frame according to claim 1, wherein:
 the first frame coupling member comprises a surface that is in contact with one of surfaces having the first opening and one of surfaces having the second opening when the first frame coupling member and the second frame coupling member are coupled to each other, and
 the second frame coupling member comprises a surface that is in contact with the other of the surfaces having the first opening and the other of the surfaces having the second opening when the first frame coupling member and the second frame coupling member are coupled to each other.

4. The frame according to claim 1, wherein:
 the first frame coupling member or the second frame coupling member comprises surfaces that are in contact with the first frame member and the second frame member and are substantially perpendicular to opening directions of the first opening and the second opening.

5. The frame according to claim 1, wherein:
 the first frame member and the second frame member each comprise a coupling force transmission surface that is substantially perpendicular to a direction in which a coupling force is applied when the first frame coupling member and the second frame coupling member are coupled to each other, and
 at least either one of the first frame coupling member or the second frame coupling member comprises a surface that is in surface contact with the coupling force transmission surface.

6. The frame according to claim 1, wherein:
 the first frame coupling member comprises:
 a first extension portion; and
 a pair of second extension portions that are substantially orthogonal to the first extension portion and are substantially orthogonal to each other, and
 the second frame coupling member comprises:
 a third extension portion; and
 a pair of fourth extension portions that are substantially orthogonal to the third extension portion and are substantially orthogonal to each other, at least either one of the first extension portion or the third extension portion includes the first projection, and at least either one of the pair of second extension portions or the pair of third extension portions includes the second projection.

7. The frame according to claim 1, wherein:
either one of the first frame coupling member or the second frame coupling member comprises a recess, and
the other of the first frame coupling member or the second frame coupling member comprises a projection that fits into the recess.

8. An electronic apparatus comprising:
a frame that comprises:
- a first frame member that has a first opening at an end portion thereof,
- a second frame member that has a second opening at an end portion thereof,
- a first frame coupling member that comprises a first projection that fits into the first opening and a second projection that fits into the second opening, and
- a second frame coupling member that is coupled to the first frame coupling member,
- grooves that are provided in the first frame member, the second frame member, the first frame coupling member, and the second frame coupling member, and
- a plate that is inserted into the grooves; and
an electronic device stored in the frame,
wherein the first frame member and the second frame member are located so as to be sandwiched between the first frame coupling member and the second frame coupling member when the first frame coupling member and the second frame coupling member are coupled to each other.

9. A method of manufacturing a coupled frame, the method comprising:
providing grooves in a first frame member, a second frame member, a first frame coupling member, and a second frame coupling member;
fitting a first opening that is provided at an end portion of the first frame member, onto a first projection that is provided in the first frame coupling member;
fitting a second opening that is provided at an end portion of the second frame member, onto a second projection that is provided in the first frame coupling member;
locating the first frame member and the second frame member between the first frame coupling member and the second frame coupling member; and
coupling the first frame coupling member and the second frame coupling member;
inserting a plate into the grooves.

10. The electronic apparatus according to claim 8, further comprising a screw that couples the first frame coupling member and the second frame coupling member.

11. The electronic apparatus according to claim 8, wherein:
the first frame coupling member comprises a surface that is in contact with one of surfaces having the first opening and one of surfaces having the second opening when the first frame coupling member and the second frame coupling member are coupled to each other, and
the second frame coupling member comprises a surface that is in contact with the other of the surfaces having the first opening and the other of the surfaces having the second opening when the first frame coupling member and the second frame coupling member are coupled to each other.

12. The electronic apparatus according to claim 8, wherein:
the first frame coupling member or the second frame coupling member comprises surfaces that are in contact with the first frame member and the second frame member and are substantially perpendicular to opening directions of the first opening and the second opening.

13. The electronic apparatus according to claim 8, wherein:
the first frame member and the second frame member each comprise a coupling force transmission surface that is substantially perpendicular to a direction in which a coupling force is applied when the first frame coupling member and the second frame coupling member are coupled to each other, and
at least either one of the first frame coupling member or the second frame coupling member comprises a surface that is in surface contact with the coupling force transmission surface.

14. The electronic apparatus according to claim 8, wherein:
the first frame coupling member comprises:
a first extension portion; and
a pair of second extension portions that are substantially orthogonal to the first extension portion and are substantially orthogonal to each other, and
the second frame coupling member comprises:
a third extension portion; and
a pair of fourth extension portions that are substantially orthogonal to the third extension portion and are substantially orthogonal to each other,
at least either one of the first extension portion or the third extension portion includes the first projection, and
at least either one of the pair of second extension portions or the pair of third extension portions includes the second projection.

15. The electronic apparatus according to claim 8, wherein:
either one of the first frame coupling member or the second frame coupling member comprises a recess, and
the other of the first frame coupling member or the second frame coupling member comprises a projection that fits into the recess.

* * * * *